(12) United States Patent
Pandey et al.

(10) Patent No.: US 11,881,523 B2
(45) Date of Patent: Jan. 23, 2024

(54) HETEROJUNCTION BIPOLAR TRANSISTORS

(71) Applicant: GLOBALFOUNDRIES U.S. Inc., Malta, NY (US)

(72) Inventors: Shesh Mani Pandey, Saratoga Springs, NY (US); Vibhor Jain, Williston, VT (US); Judson R. Holt, Ballston Lake, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/740,725

(22) Filed: May 10, 2022

(65) Prior Publication Data

US 2023/0369473 A1 Nov. 16, 2023

(51) Int. Cl.
  *H01L 29/737* (2006.01)
  *H01L 29/10* (2006.01)
  *H01L 29/66* (2006.01)

(52) U.S. Cl.
  CPC ...... *H01L 29/7371* (2013.01); *H01L 29/1004* (2013.01); *H01L 29/66242* (2013.01)

(58) Field of Classification Search
  CPC ........... H01L 29/1004; H01L 29/66242; H01L 29/66272; H01L 29/7371
  See application file for complete search history.

(56) References Cited

U.S. PATENT DOCUMENTS

| | | |
|---|---|---|
| 6,232,649 B1 | 5/2001 | Lee |
| 6,555,874 B1 | 4/2003 | Hsu et al. |
| 7,462,923 B1 | 12/2008 | U'Ren |
| 8,441,084 B2 | 5/2013 | Cai et al. |
| 9,437,718 B1 | 9/2016 | Cai et al. |
| 9,502,504 B2 | 11/2016 | Cai et al. |
| 9,748,369 B2 | 8/2017 | Liu |
| 2003/0207512 A1 | 11/2003 | Hsu |
| 2004/0222436 A1* | 11/2004 | Joseph ................ H01L 27/1203 257/E21.372 |
| 2008/0164494 A1* | 7/2008 | Pagette ............... H01L 29/0821 257/E29.174 |
| 2008/0308837 A1 | 12/2008 | Gauthier, Jr. et al. |
| 2013/0001647 A1 | 1/2013 | Adler |
| 2013/0119434 A1 | 5/2013 | Adkisson |
| 2015/0140771 A1 | 5/2015 | Fox et al. |
| 2015/0270335 A1 | 9/2015 | Sadovnikov et al. |
| 2021/0091180 A1 | 3/2021 | Pekarik et al. |

(Continued)

OTHER PUBLICATIONS

Ning et al., "A perspective on SOI symmetric Lateral Bipolar Transistor for ultra-low-power systems", Electron Devices Society, Apr. 7, 2016, 10 pages.

(Continued)

*Primary Examiner* — Syed I Gheyas

(74) *Attorney, Agent, or Firm* — Francois Pagette; Andrew M. Calderon; Calderon Safran & Cole P.C.

(57) ABSTRACT

The present disclosure relates to semiconductor structures and, more particularly, to heterojunction bipolar transistors and methods of manufacture. The structure includes: a subcollector under a buried insulator layer; a collector above the subcollector; a base within the buried insulator layer; an emitter above the base; and contacts to the subcollector, the base and the emitter.

16 Claims, 17 Drawing Sheets

(56) References Cited

U.S. PATENT DOCUMENTS

2021/0091213 A1   3/2021   Jain et al.

OTHER PUBLICATIONS

Koričić et al., "Double-Emitter Reduced-Surface-Field Horizontal Current Bipolar Transistor With 36 V Breakdown Integrated in BiCMOS at Zero Costar", IEEE Electron Device Letters, vol. 36, No. 2, Feb. 2015, 3 pages.
Suligoj et al., "Horizontal Current Bipolar Transistor With a Single Polysilicon Region for Improved High-Frequency Performance of BiCMOS ICs", IEEE Electron Device Letters, vol. 31, No. 6, Jun. 2010, 3 pages.
Application and Drawings for U.S. Appl. No. 17/580,127, filed Jan. 20, 2022, 29 pages.
EP Search Report in EP Application No. 222007139.0-1212 dated May 23, 2023, 12 pages.
Search Report in related EP Application No. 22199933-1212 dated Jun. 26, 2023, 10 pages.
Office Action in U.S. Appl. No. 17/580,127 dated Jun. 7, 2023, 11 pages.

* cited by examiner

HETEROJUNCTION BIPOLAR TRANSISTORS

BACKGROUND

The present disclosure relates to semiconductor structures and, more particularly, to heterojunction bipolar transistors and methods of manufacture.

Bipolar transistors can be vertical transistors or lateral transistors. Vertical bipolar transistors can be used for many different types of applications, e.g., ranging from high performance applications to low performance applications. For example, bipolar transistors can be used in mm-wave power amplifiers and low noise amplifiers, automotive radars and optical interconnects.

Typically, heterojunction bipolar transistors are formed in bulk substrate or in a cavity touching a handle wafer for a semiconductor-on-insulator (SOI) substrate. To manufacture these devices, many complex and costly processing steps are required such as multiple epitaxial growth processes and masking processes. These processes can be very repetitive during the fabrication processes leading to additional unwanted costs.

SUMMARY

In an aspect of the disclosure, a structure comprises: a subcollector under a buried insulator layer; a collector above the subcollector; a base within the buried insulator layer; an emitter above the base; and contacts to the subcollector, the base and the emitter.

In an aspect of the disclosure, a structure comprises: a handle substrate comprising semiconductor material; a buried oxide layer above the handle substrate; and a heterojunction bipolar substrate comprising: a subcollector within the handle substrate; a base above the subcollector and within he buried oxide layer; and an emitter above the base; and contacts to the subcollector, the base and the emitter.

In an aspect of the disclosure, a method comprises: forming a subcollector under a buried insulator layer; forming a collector above the subcollector and a base within the buried insulator layer in a single epitaxial growth process; forming an emitter above the base in another epitaxial growth process; and forming contacts to the subcollector, the base and the emitter.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to heterojunction bipolar transistors and methods of manufacture. More specifically, the heterojunction bipolar transistors may be vertical heterojunction bipolar transistors with self-aligned emitter, base and collector regions using semiconductor on insulator technologies. In embodiments, the base may be within a buried insulator layer (e.g., buried oxide layer) of the semiconductor-on-insulator (SOI) technologies.

Advantageously, the present disclosure provides a lower cost technology by reducing the number of epitaxial growth passes, while also reducing mask count (e.g., three masks vs. six masks for conventional manufacturing processes). In addition, the self-aligned emitter, base and collector regions exhibit a low parasitic compared to conventional structures.

In more specific embodiments, the heterojunction bipolar transistor includes a vertical aligned emitter, base and collector, with the base (e.g., intrinsic base and extrinsic base) being within a buried oxide region of the semiconductor-on-insulator (SOI) technologies. In embodiments, the emitter, base and collector may be a same width, each of which may be grown by epitaxial growth processes. In further embodiments, a marker layer, e.g., SiGe, may be provided between the extrinsic base and the intrinsic base. The marker layer may have a lower Ge concentration than the intrinsic base, as an example. A spacer may separate the emitter and extrinsic base, with another spacer provided around the base and collector boundary.

The heterojunction bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the heterojunction bipolar transistors of the present disclosure have been adopted from integrated circuit (IC) technology. For example, the structures are built on wafers and are realized in films of material patterned by photolithographic processes on the top of a wafer. In particular, the fabrication of the heterojunction bipolar transistors uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1A:
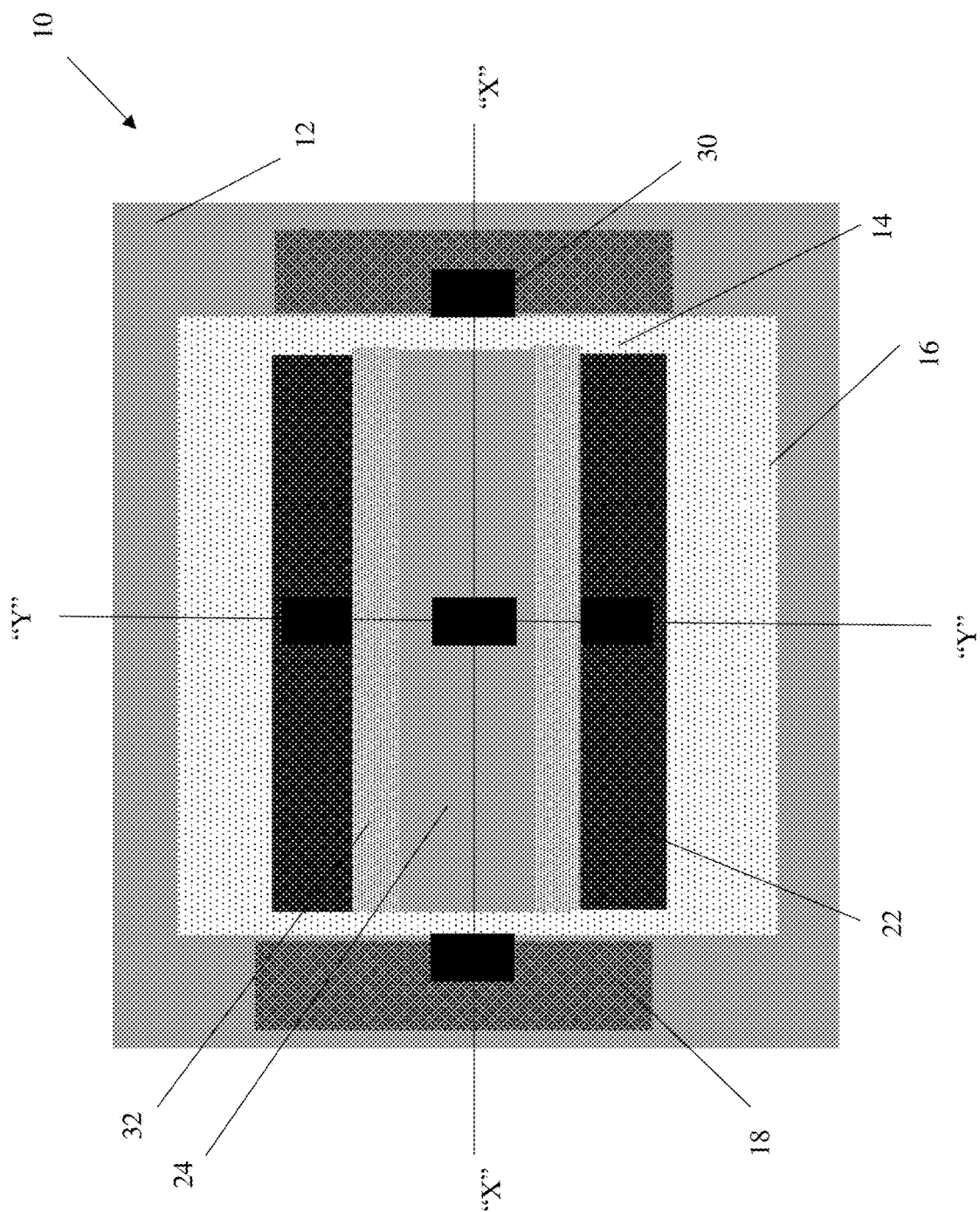
FIG. 1A shows a top view of a heterojunction bipolar transistor in accordance with aspects of the present disclosure.
Figure 1B:
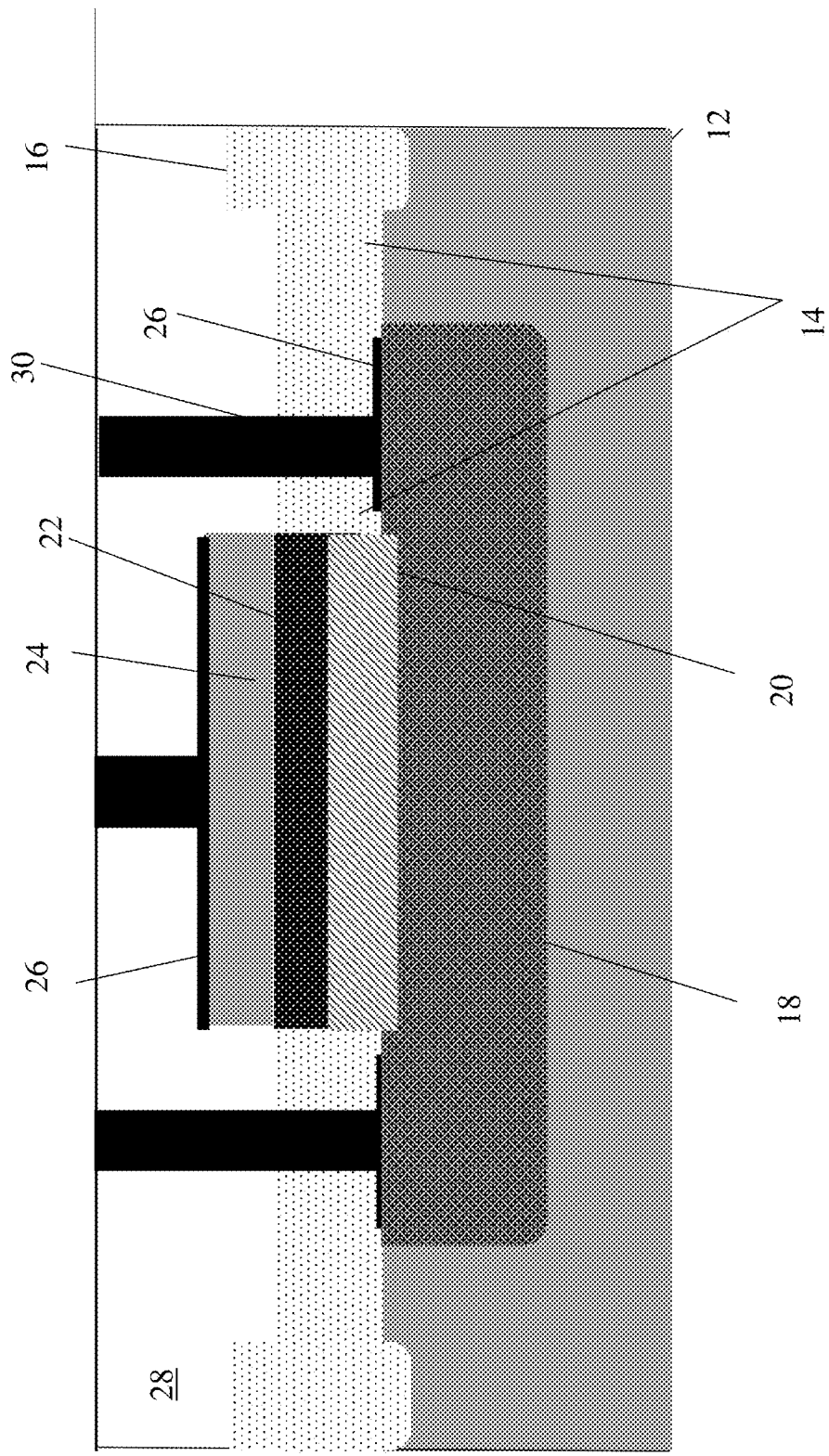
FIG. 1B shows a cross-sectional view along an "X" axis of the heterojunction bipolar transistor shown in FIG. 1A.
Figure 1C:
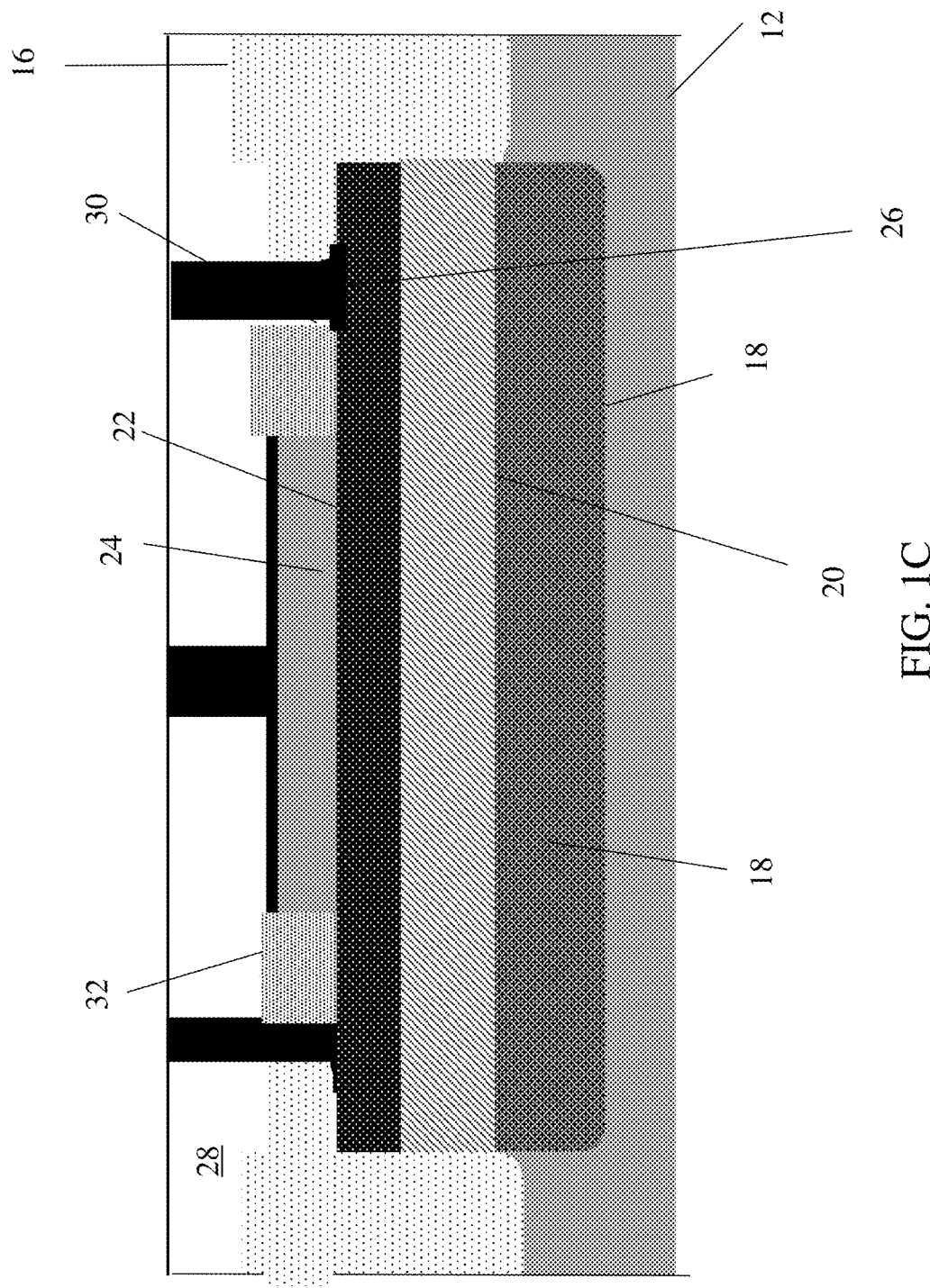
FIG. 1C shows a cross-sectional view along a "Y" axis of the heterojunction bipolar transistor shown in FIG. 1A.

FIG. 1A shows a top view of a heterojunction bipolar transistor 10; whereas FIG. 1B shows a cross-sectional view along an "X" axis of the heterojunction bipolar transistor 10 and FIG. 1C shows a cross-sectional view along a "Y" axis of the heterojunction bipolar transistor 10. Referring to FIGS. 1A-1C, the heterojunction bipolar transistor 10 includes a semiconductor substrate 12 with a buried insulator layer 14. In embodiments, the semiconductor substrate 12 is a handle wafer used in semiconductor-on-insulator (SOI) technology and the buried insulator layer 14 is an insulator under a top semiconductor layer (not shown).

The semiconductor substrate 12 may be composed of any suitable semiconductor material including, but not limited to, Si, SiGe, SiGeC, SiC, GaAs, InAs, InP, and other III/V or II/VI compound semiconductors. In further embodiments, the semiconductor substrate 12 may be a p-substrate with any suitable crystallographic orientation (e.g., a (100), (110), (111), or (001) crystallographic orientation). The buried insulator layer 14 may comprise any suitable material, including silicon oxide, sapphire, other suitable insulating materials, and/or combinations thereof. An exemplary insulator layer 14 may be a buried oxide layer (BOX) formed by any suitable process, such as separation by implantation of oxygen (SIMOX), oxidation, deposition, and/or other suitable process.

A subcollector 18 may be formed in the semiconductor substrate 12 under the buried insulator layer 14. In embodiments, the subcollector 18 may be an N-type material formed by a conventional in-situ epitaxial growth process described in more detail with respect to FIG. 6C. For example, the subcollector 18 may be a semiconductor material heavily doped with n-type dopants, e.g., Arsenic (As), Phosphorus (P) and Antimony (Sb), among other suitable examples.

A collector 20, base 22 (e.g., intrinsic base and extrinsic base on a same level of the device with a planar surface) and emitter 24 may be formed over and in vertical alignment with the subcollector 18. In embodiments, the collector 20, base 22 and emitter 24 may be formed by epitaxial growth processes. In more specific embodiments, the collector 20, base 22 and emitter 24 may be grown with two epitaxial growth passes as shown in FIGS. 6C and 6D. The collector 20 may be Si material and, more specifically, SiC or SiP material. The base 22 may be Si or SiGe material, with a Ge concentration of above 15%. In embodiments, the Ge concentration of the SiGe material may be graded or uniform. The emitter 24 may be N+Si or N+ polysilicon material, as an example.

In embodiments, at least the base 22 may be provided within the buried insulator layer 14. In optional embodiments, the collector 20 and the emitter 24 may also be within the buried insulator layer 14. In still further embodiments, the emitter 24 may be above or partially within the buried insulator layer 14. In further embodiments, the collector 20, base 22 and emitter 24 may have a same width along the "X" axis (see, e.g., FIG. 1B); whereas the base 22 (e.g., the extrinsic base region) may laterally extend beyond, e.g., overlap, an edge of the emitter 24 in the "Y" axis of FIG. 1C.

In this way, a contact 30 can extend to and electrically contact (e.g., directly contact) to the extrinsic base portion of the base 22.

The collector 20, base 22 and emitter 24 may be isolated from other devices by shallow trench isolation structures 16. The shallow trench isolation structures 16 extend through the buried insulator layer 14 to the semiconductor substrate 12. The shallow trench isolation structures 16 may be formed by conventional lithography, etching and deposition methods known to those of skill in the art, as further described with respect to FIG. 6A.

In embodiments, the buried insulator layer 14 (e.g., BOX) may isolate the contacts 30 of the subcollector 14 from the base 22 (as shown along the "X" axis in FIG. 1B), whereas a sidewall spacer 32 (in combination with or in the absence of the buried insulator layer 14) may isolate the contacts 30 of the base 22 from the emitter 24 (as shown along the "Y" axis in FIG. 1C). In embodiments, the sidewall spacer 32 may be nitride or oxide or combination thereof, formed by conventional lithography, etching and deposition methods, e.g., chemical vapor deposition (CVD) processes as described with respect to FIG. 6D.

Still referring to FIGS. 1A-1C, an interlevel dielectric material 28 may be formed, e.g., deposited, over the collector 20, base 22 and emitter 24. In embodiments, the interlevel dielectric material 28 may be alternating layers of oxide and nitride, as an illustrative example. The contacts 30 (e.g., orthogonal to surfaces of the collector 20, base 22 and emitter 24) may be formed through the interlevel dielectric material 28 to the collector 20, base 22 and emitter 24 using conventional lithography, etching and deposition methods as further described herein. Prior to forming the contacts 30, silicide 26, e.g., NiSi, may be formed on the semiconductor material of the collector 20, base 22 and emitter 24.

Figure 2A:
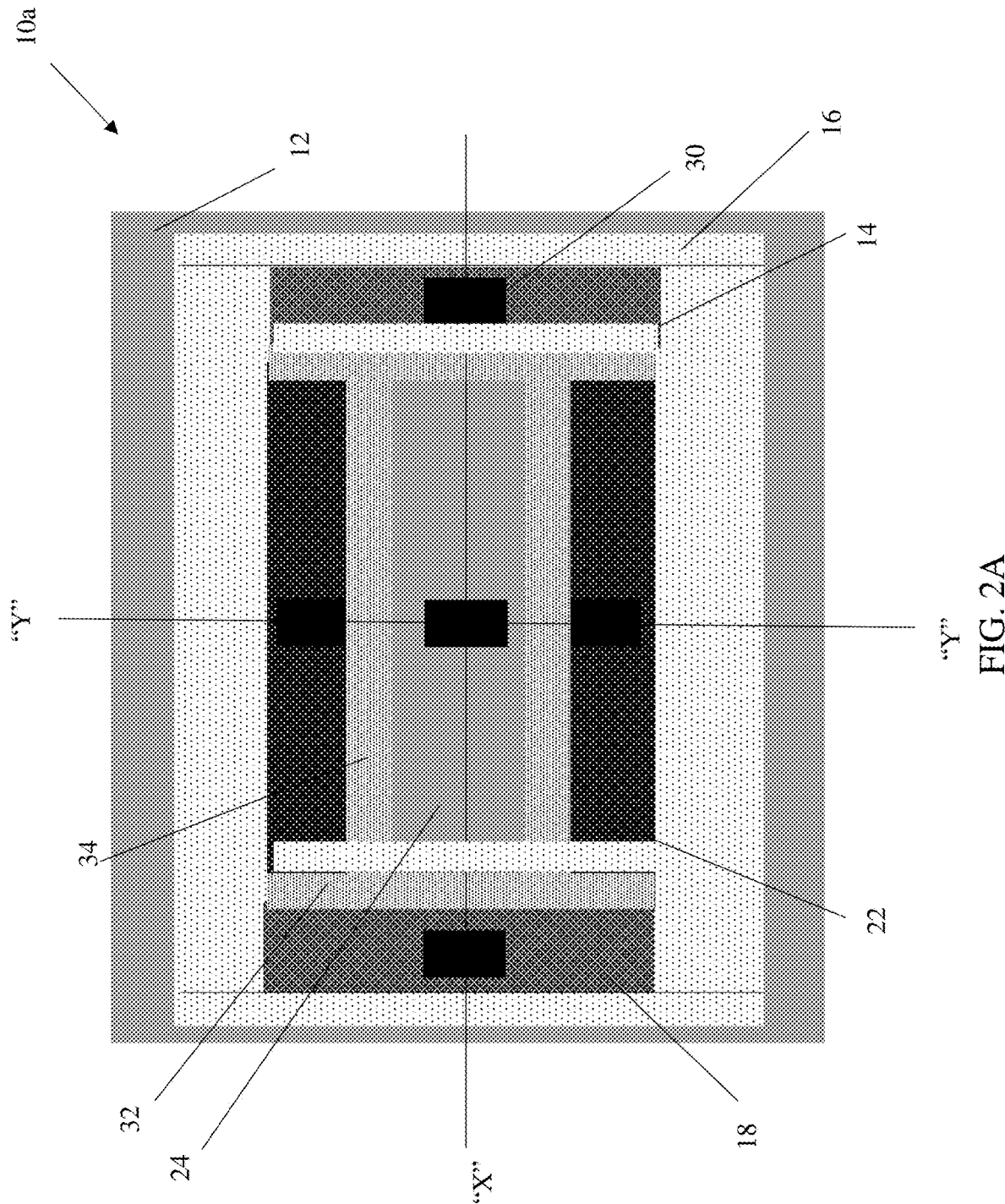
FIG. 2A shows a top view of a heterojunction bipolar transistor in accordance with another aspect of the present disclosure.
Figure 2B:
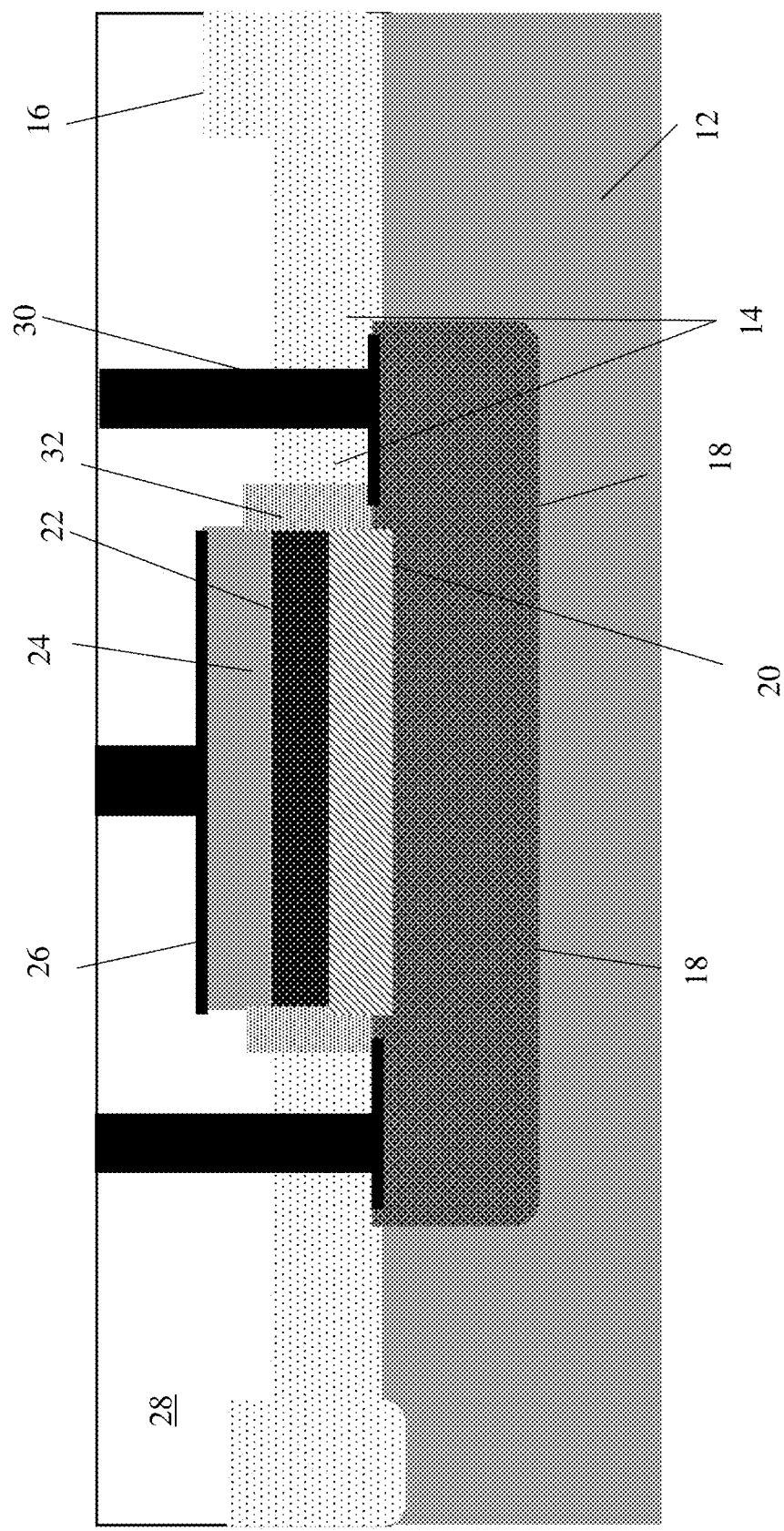
FIG. 2B shows a cross-sectional view along an "X" axis of the heterojunction bipolar transistor shown in FIG. 2A.
Figure 2C:
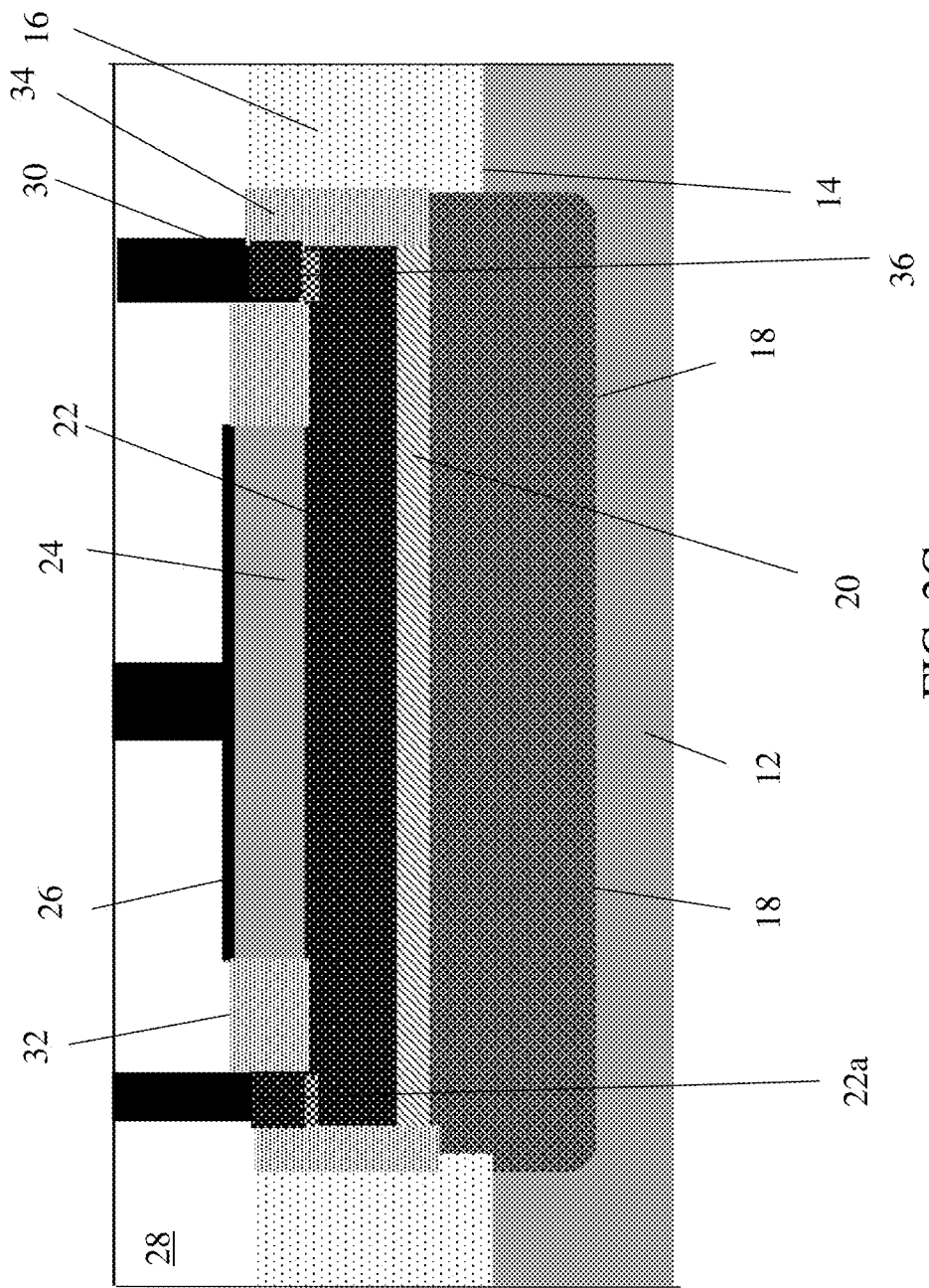
FIG. 2C shows a cross-sectional view along a "Y" axis of the heterojunction bipolar transistor shown in FIG. 2A.

FIG. 2A shows a top view of a heterojunction bipolar transistor 10a in accordance with additional aspects of the present disclosure. FIG. 2B shows a cross-sectional view along the "X" axis of the heterojunction bipolar transistor 10a and FIG. 2C shows a cross-sectional view along the "Y" axis of the heterojunction bipolar transistor 10a. It should be understood that the same reference numerals for similar features are used throughout FIGS. 1A-2C.

Referring to FIGS. 2A-2C, the heterojunction bipolar transistor 10a includes a marker layer 36 between the extrinsic base 22a and the intrinsic base 22. In embodiments, the marker layer 36 may be SiGe, with a concentration of Ge of less than 15% and preferably about 5% to 15%. In embodiments, the extrinsic base 22a may be vertically aligned with and above the intrinsic base 22 as shown in FIG. 2C. Both the extrinsic base 22a and the intrinsic base 22 may be provided within the buried insulator layer 14. A spacer 32 separates the extrinsic base 22a from the emitter 24 and a spacer 34 may be provided around the boundary of the base 22 and collector 20.

The remaining features of the heterojunction bipolar transistor 10a are similar to that described in FIGS. 1A-1C. For example, the subcollector 18 is formed in the handle semiconductor substrate 12. Moreover, for example, the collector 20, intrinsic base 22 and emitter 24 are vertically aligned and formed using epitaxial growth processes. In this embodiment, only two epitaxial passes may be required for the fabrication of the collector 20, intrinsic base 22, marker layer 36, extrinsic base 22a and emitter 24.

Figure 3:
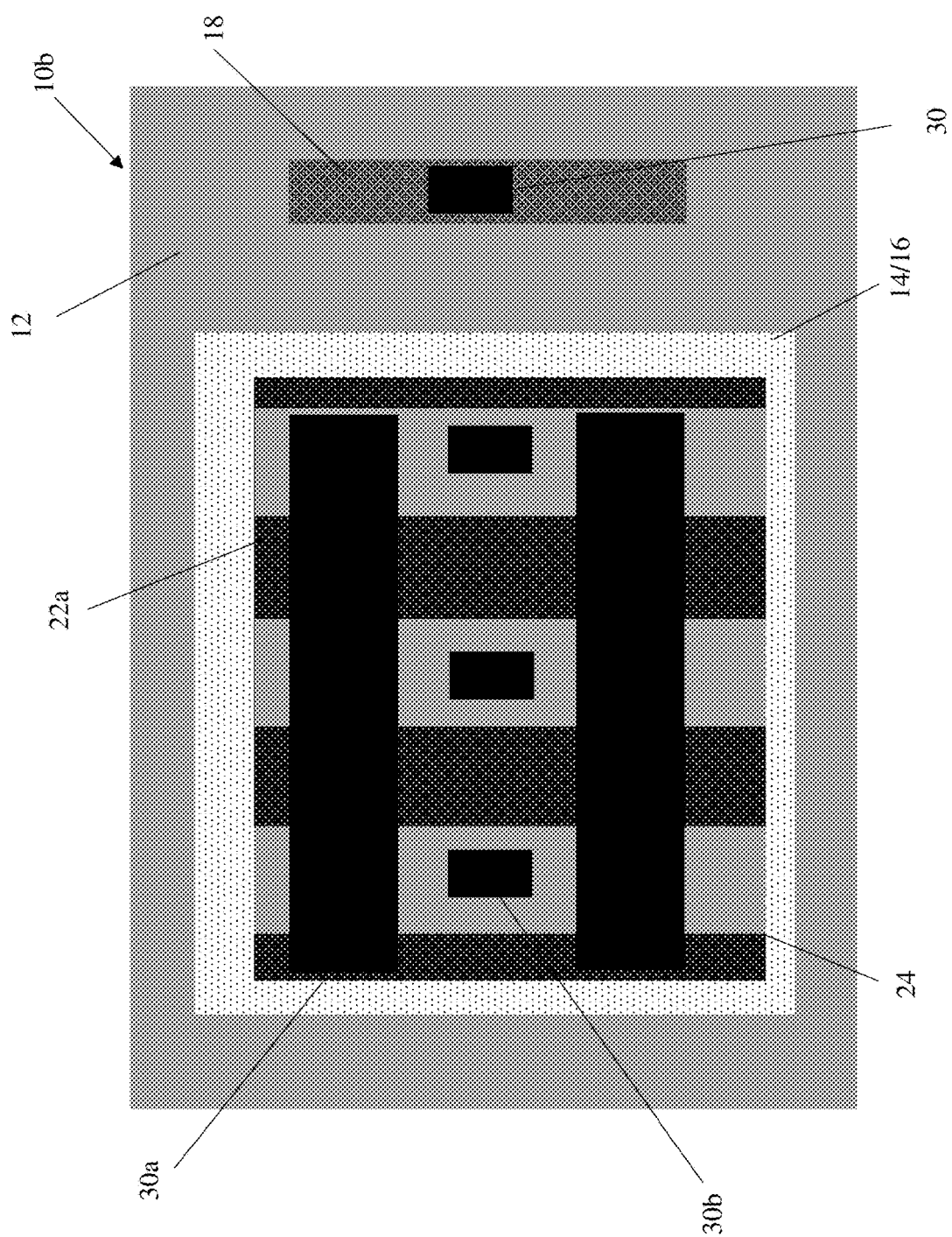
FIG. 3 shows a top view of a heterojunction bipolar transistor in accordance with additional aspects of the present disclosure.

FIG. 3 shows a top view of a heterojunction bipolar transistor in accordance with additional aspects of the present disclosure. In particular, the heterojunction bipolar transistor 10b of FIG. 3 includes multiple emitters 24 with respective emitter contacts 30b. The extrinsic base 22a may be underneath the multiple emitters 24. In embodiments, the extrinsic base 22a and/or intrinsic base may be in the buried insulator layer 14.

Contacts 30a extend longitudinally over and make contact to the extrinsic base 22a. It should be understood by those of skill in the art that the contacts 30a are electrically isolated from the multiple emitters 24 by insulator material. The subcollector 18 may be provided on a side of the extrinsic base 22a and the multiple emitters 24. The subcollector 18 may be electrically isolated from the extrinsic base 22a and the multiple emitters 24 by one or a combination of the buried insulator layer 14 and shallow trench isolation structures 16. A contact 30 extends to and electrically connects to the subcollector 18.

Figure 4:
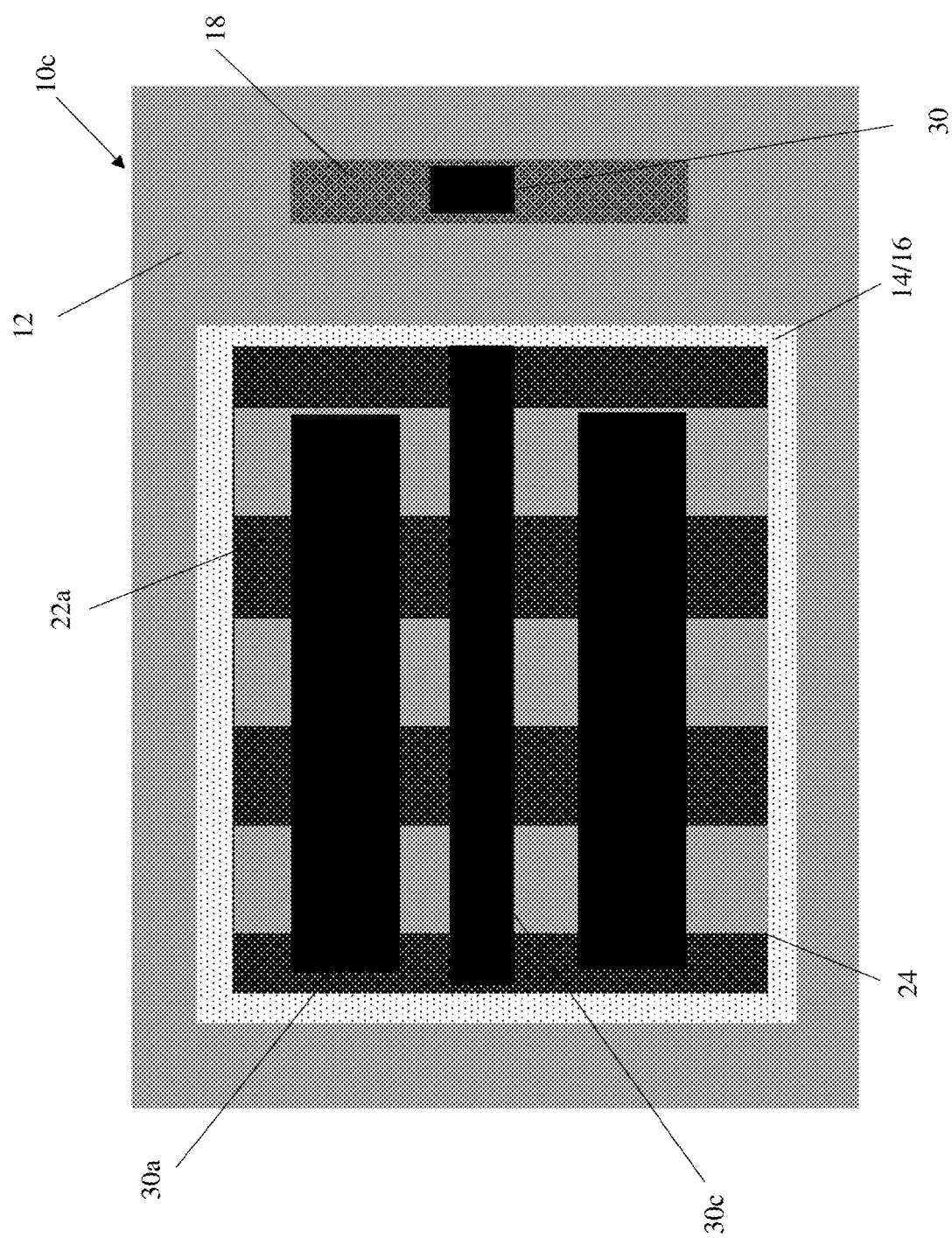
FIG. 4 shows a top view of a heterojunction bipolar transistor in accordance with further aspects of the present disclosure.

FIG. 4 shows a top view of a heterojunction bipolar transistor in accordance with further aspects of the present disclosure. In the heterojunction bipolar transistor 10c of FIG. 4, a single contact 30c may be electrically connected to the multiple emitters 24. The remaining features are similar to the that heterojunction bipolar transistor 10b described in FIG. 3.

Figure 5A:
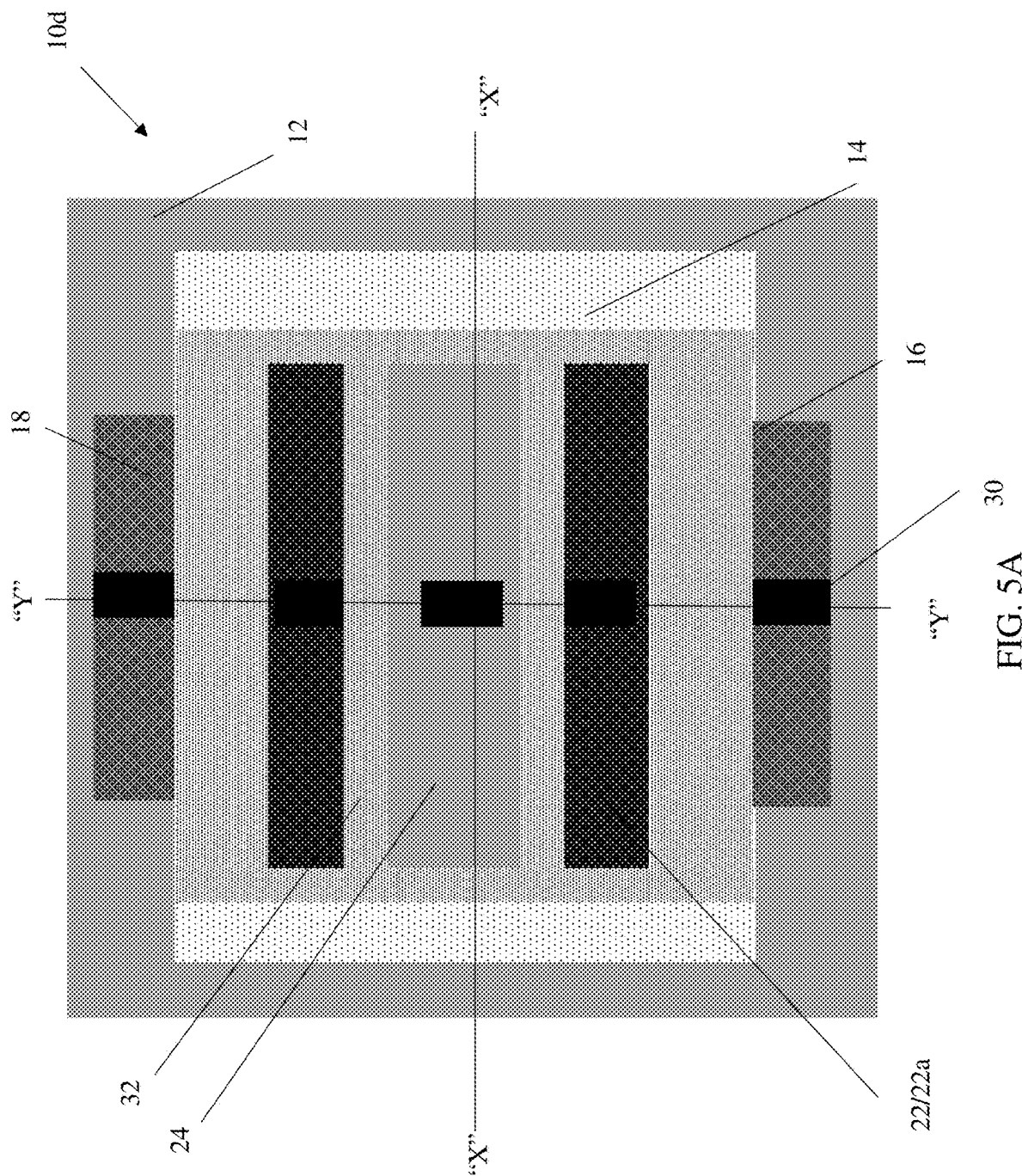
FIG. 5A shows a top view of a heterojunction bipolar transistor in accordance with another aspect of the present disclosure.
Figure 5B:
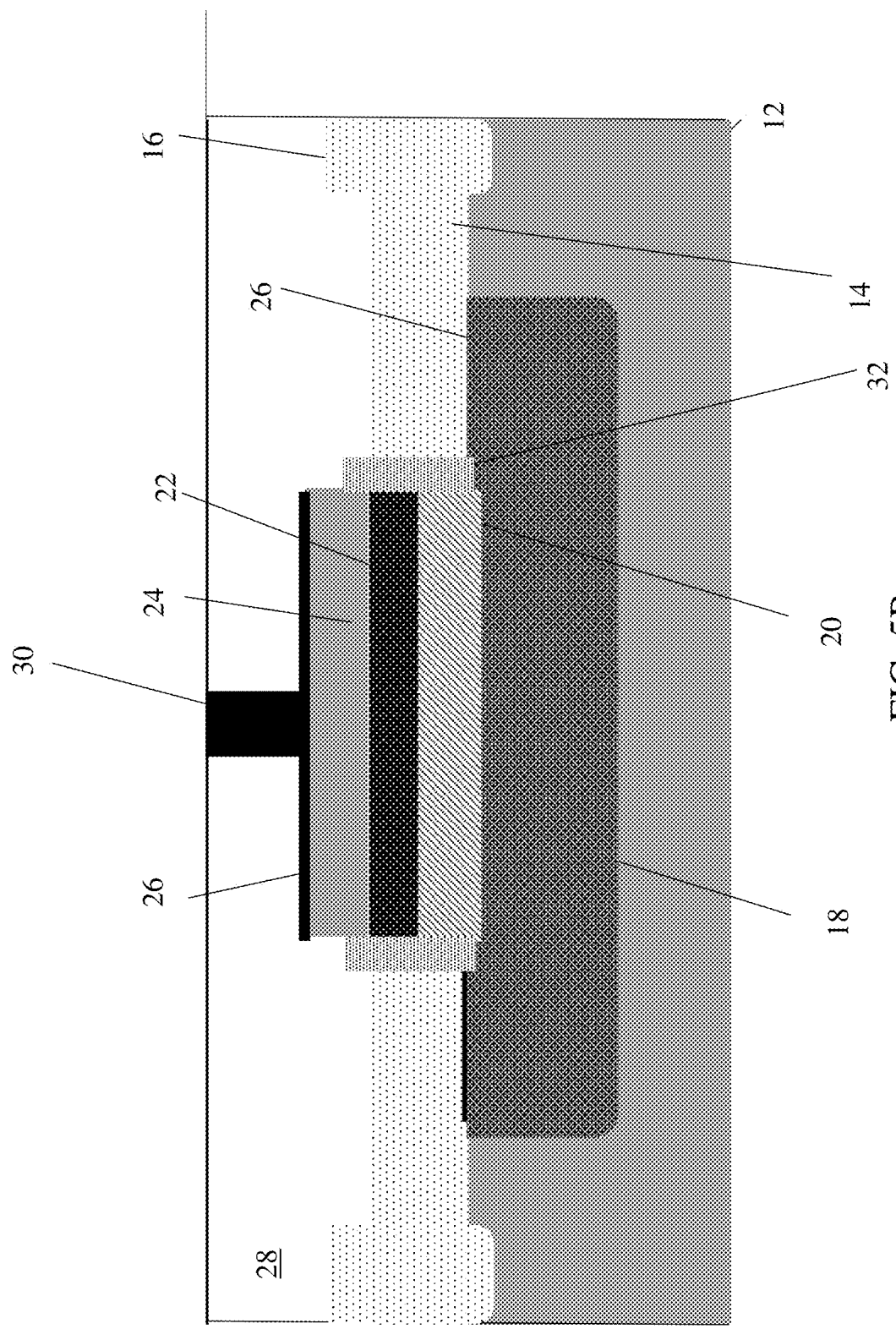
FIG. 5B shows a cross-sectional view along an "X" axis of the heterojunction bipolar transistor shown in FIG. 5A.
Figure 5C:
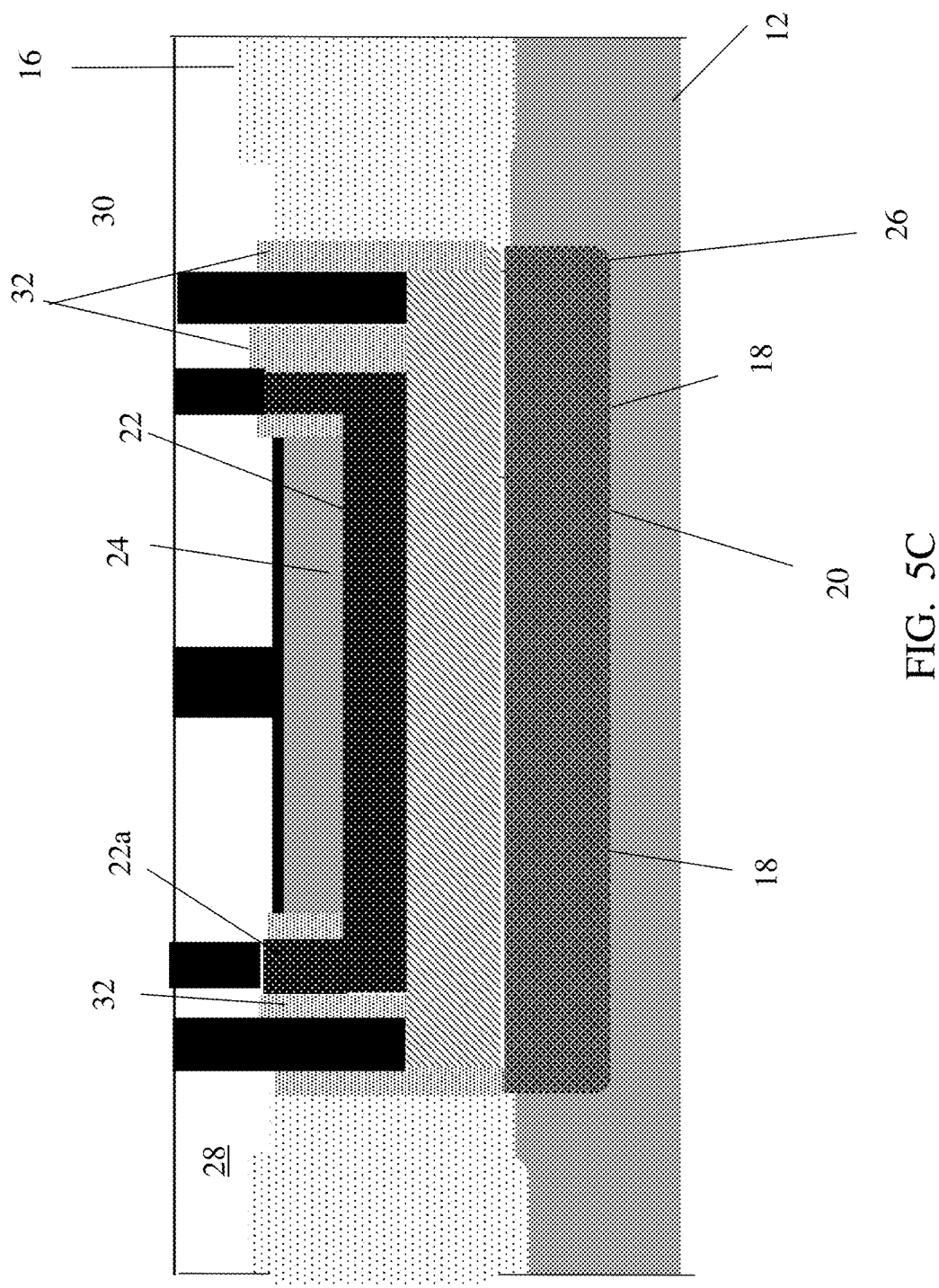
FIG. 5C shows a cross-sectional view along a "Y" axis of the heterojunction bipolar transistor shown in FIG. 5A.

FIG. 5A shows a top view of a heterojunction bipolar transistor 10d; whereas FIG. 5B shows a cross-sectional view along an "X" axis of the heterojunction bipolar transistor 10d and FIG. 5C shows a cross-sectional view along a "Y" axis of the heterojunction bipolar transistor 10d. Referring to FIGS. 5A-5C, the heterojunction bipolar transistor 10d includes the contacts 30 for the subcollector 18, extrinsic base 22a and emitter 24 in axial alignment. In addition, in the "Y" cross-sectional view, the base 22 is a U-shaped configuration which accommodates the emitter 24. The base 22 and the emitter 24 are separated by spacers 32. The spacers 32 may also surround the contacts 30, in addition to isolating the contacts 30 from the base 22, e.g., legs of the U-shaped configuration of the base 22. It should be understood that the legs of the U-shaped configuration of the base 22 are part of an extrinsic base 22a contacts 30 extend and contact thereto. The remaining features of the heterojunction bipolar transistor 10d are similar to that described in FIGS. 1A-1C. In this embodiment, only two epitaxial passes may be required for the fabrication of collector 20, intrinsic base 22, extrinsic base 22a and emitter 24.

Figure 6A:
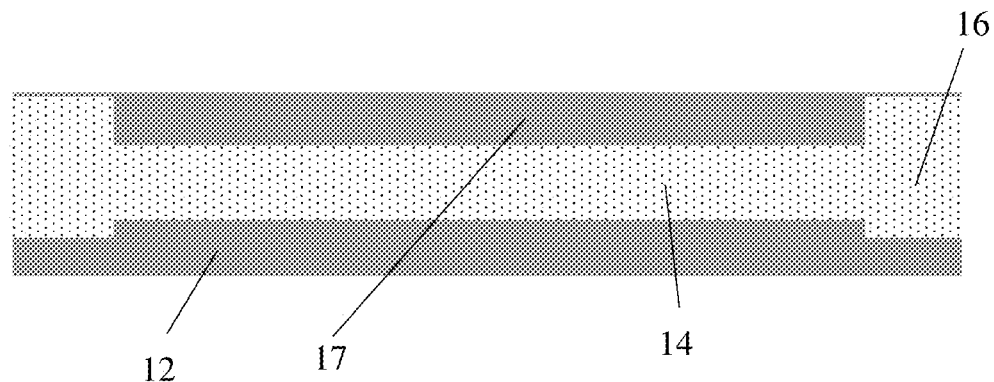
FIGS. 6A-6E show fabrication processes for manufacturing the heterojunction bipolar transistor shown in FIGS. 1A-1C in accordance with further aspects of the present disclosure.
Figure 6B:
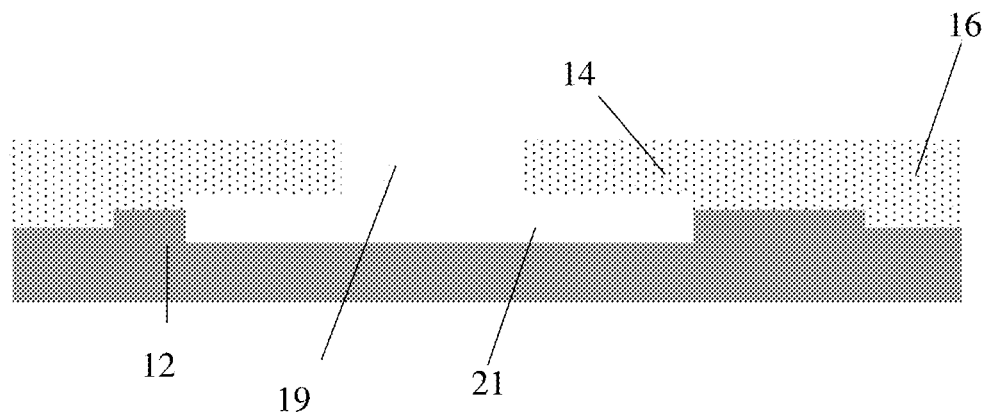
Figure 6C:
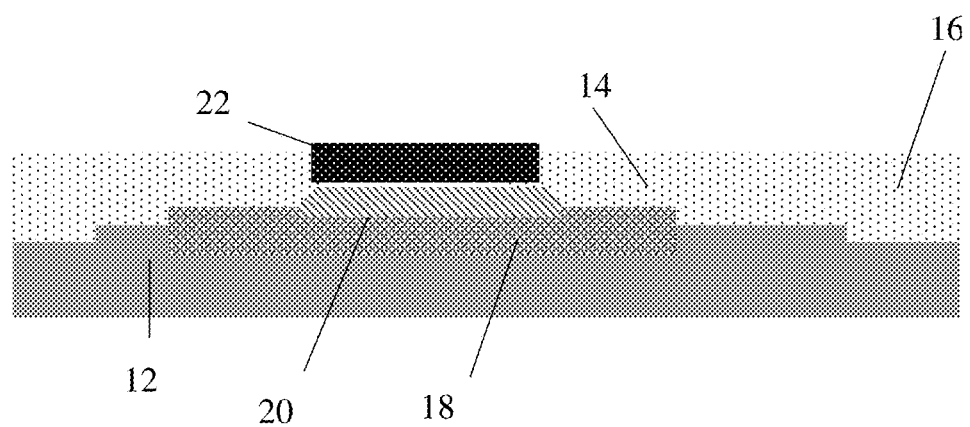
Figure 6D:
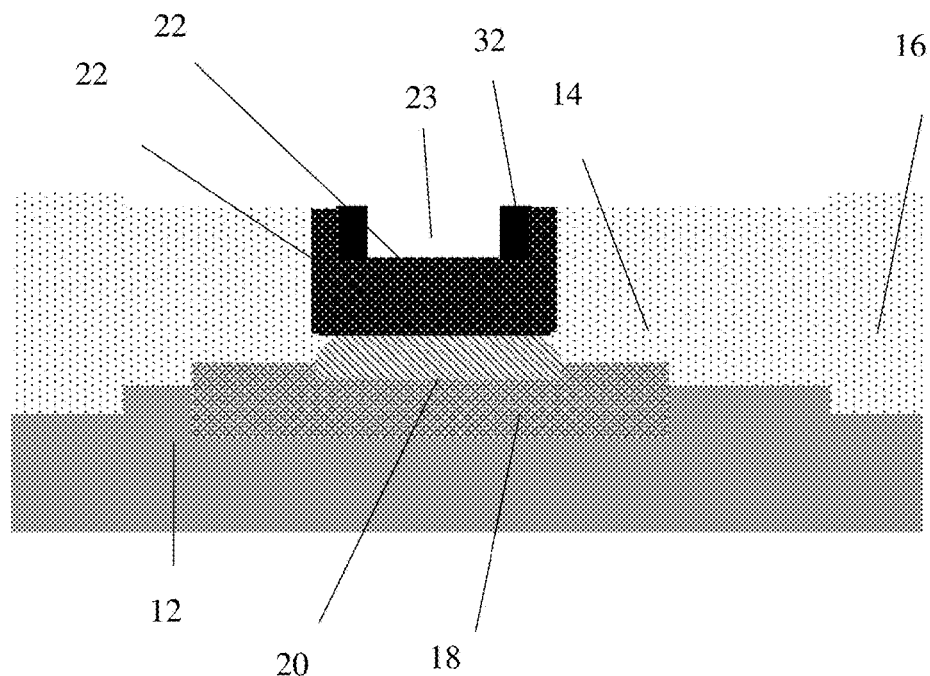

FIGS. 6A-6E show fabrication processes for manufacturing the heterojunction bipolar transistor 10 shown in FIGS. 1A-1C. Specifically, FIG. 6A shows a semiconductor-on-insulator (an) substrate comprising the semiconductor substrate 12 with the buried insulator layer 14 and a semiconductor layer 17 on top of the buried insulator layer 14. Similar to the semiconductor substrate 12, the semiconductor layer 17 may be composed of any suitable semiconductor material including, but not limited to, Si, SiGe, SiGeC, SiC, GaAs, InAs, InP, and other III/V or II/VI compound semiconductors. In further embodiments, the semiconductor layer 17 may be any suitable crystallographic orientation (e.g., a (100), (110), (111), or (001) crystallographic orientation).

Shallow trench isolation structures 16 extend through the buried insulator layer 14 to the semiconductor substrate 12. The shallow trench isolation structures 16 may be formed by conventional lithography, etching and deposition methods known to those of skill in the art. For example, a resist formed over a top semiconductor layer 17 is exposed to energy (light) to form a pattern (opening). An etching process with a selective chemistry, e.g., reactive ion etching (RIE), will be used to transfer the pattern to form one or more trenches in the buried insulator layer 14 (and top semiconductor layer 17). Following the resist removal by a conventional oxygen ashing process or other known stripants, the insulator material (e.g., $SiO_2$) can be deposited by any conventional deposition processes, e.g., chemical vapor deposition (CVD) processes. Any residual material can be removed by conventional chemical mechanical polishing (CMP) processes.

As shown FIG. 6B, a trench 19 is formed through the buried insulator layer 14 (and top semiconductor layer 17, if not removed) with an optional cavity 21 formed in the semiconductor substrate 12 underneath the buried insulator layer 14. In embodiments, the trench 19 may be formed by conventional lithography and etching processes as already noted herein. The optional cavity 21 may be formed by a wet etching process into the semiconductor substrate 12. In embodiments, the wet etch may include a lateral etch as is known in the art in order to remove semiconductor substrate 12 underneath the buried insulator layer 14. In embodiments, the lateral etch component may be optional.

In FIG. 6C, a subcollector 18 may be formed in the semiconductor substrate 12 under the buried insulator layer 14 (e.g., within the cavity 21). The collector 20 and the base 22 may be formed above the subcollector 18 within the trench 19. In embodiments, at least the base 22 may be within the buried insulator layer 14. In optional embodiments, the collector 20 may also be within the buried insulator layer 14.

The subcollector 18, collector 20 and base 22 may be formed in a single epitaxial grown process, e.g., single pass in a same chamber. The subcollector 18 may be an N-type material using an in-situ process during by epitaxial growth processes. In the in-situ process, the subcollector 18 may be heavily doped with n-type dopants, e.g., Arsenic (As), Phosphorus (P) and Antimony (Sb), among other suitable examples. The collector 20 may be Si material and, more specifically, SiC or SiP material. The base 22 may be SiGe, for example. In an alternative embodiment, the subcollector 18 may be formed directly in the semiconductor substrate 12 (e.g., without the need for the cavity) by an ion implantation process as is known in the art. The dopants may be driven into the semiconductor materials by a rapid thermal anneal process as is known in the art.

Figure 6E:
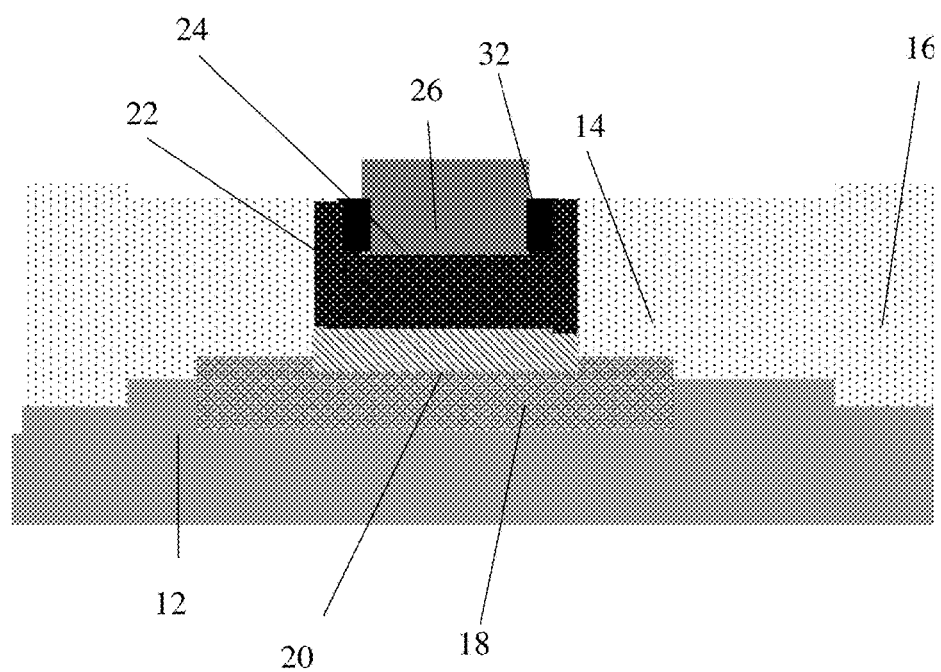

In FIG. 6D, a recess 23 is formed in the base 22 using a conventional recess etch process as is known in the art, i.e., using a resist mask and etching process. The sidewall spacers 32 may be formed within the recess 23 using conventional deposition methods, e.g., CVD, followed by an anisotropic etching process. In FIG. 6E, the emitter 26 is deposited within the recess between the sidewall spacers 32. In embodiments, the emitter 24 may be provided by a second epitaxial process.

Referring back to FIGS. 1A-1C, an interlevel dielectric material 28 may be deposited over the structure using conventional blanket deposition processes, e.g., CVD of alternating layers of oxide and nitride. The contacts 30 (e.g., orthogonal to surfaces of the collector 20, base 22 and emitter 24) may be formed through the interlevel dielectric material 28 to the collector 20, base 22 and emitter 24 using conventional lithography, etching and deposition methods.

Prior to forming the contacts 30, silicide 26, e.g., NiSi, may be formed on the collector 20, base 22 and emitter 24. As should be understood by those of skill in the art, the silicide process begins with deposition of a thin transition metal layer, e.g., nickel, cobalt or titanium, over fully formed and patterned semiconductor material of the collector 20, base 22 and emitter 24. After deposition of the material, the structure is heated allowing the transition metal to react with exposed silicon (or other semiconductor material as described herein) forming a low-resistance transition metal silicide. Following the reaction, any remaining transition metal is removed by chemical etching, leaving silicide contacts 26.

Figure 7A:
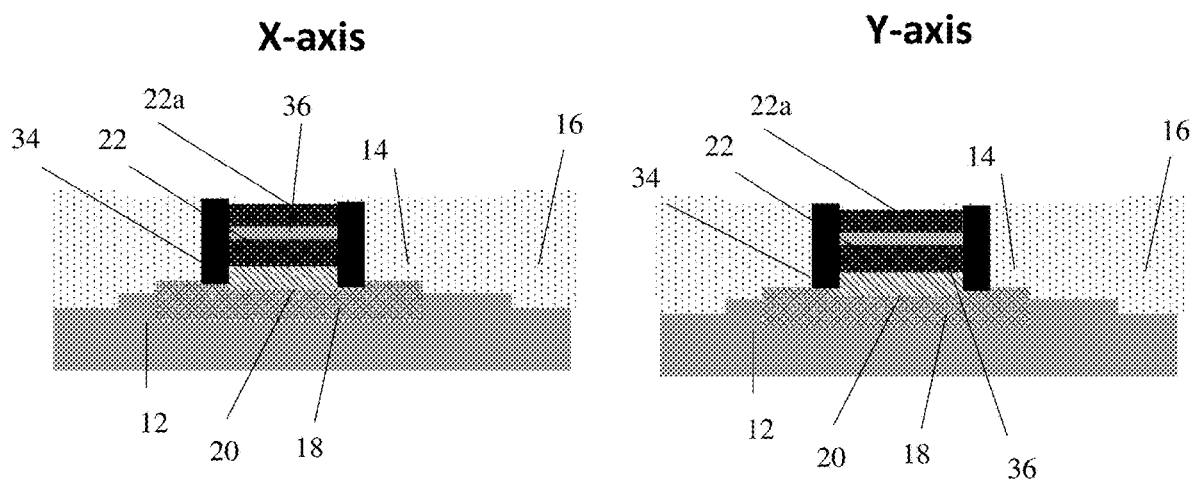
FIGS. 7A-7C show selective fabrication processes for manufacturing the heterojunction bipolar transistor shown in FIG. 2A-2C in accordance with further aspects of the present disclosure.
Figure 7B:
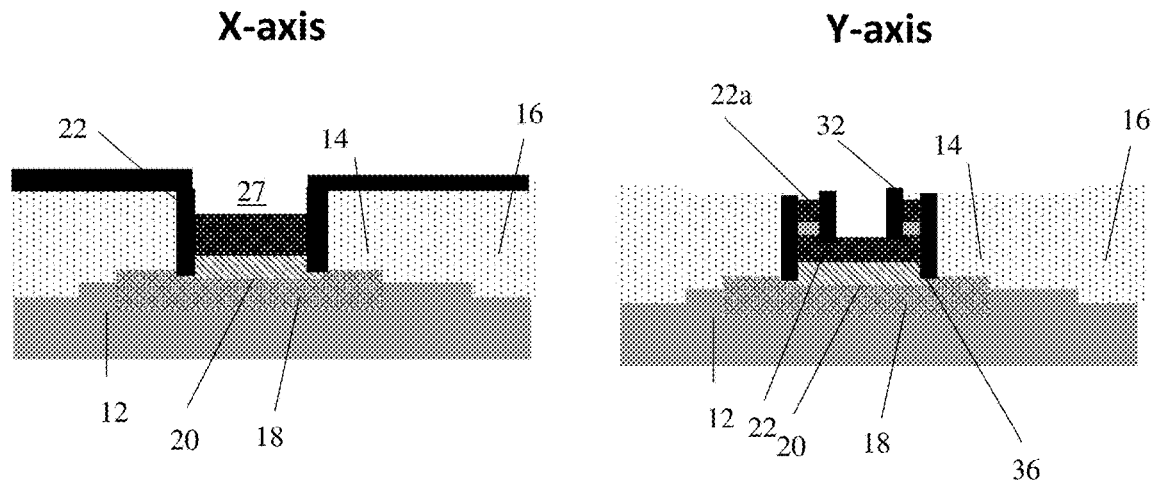
Figure 7C:
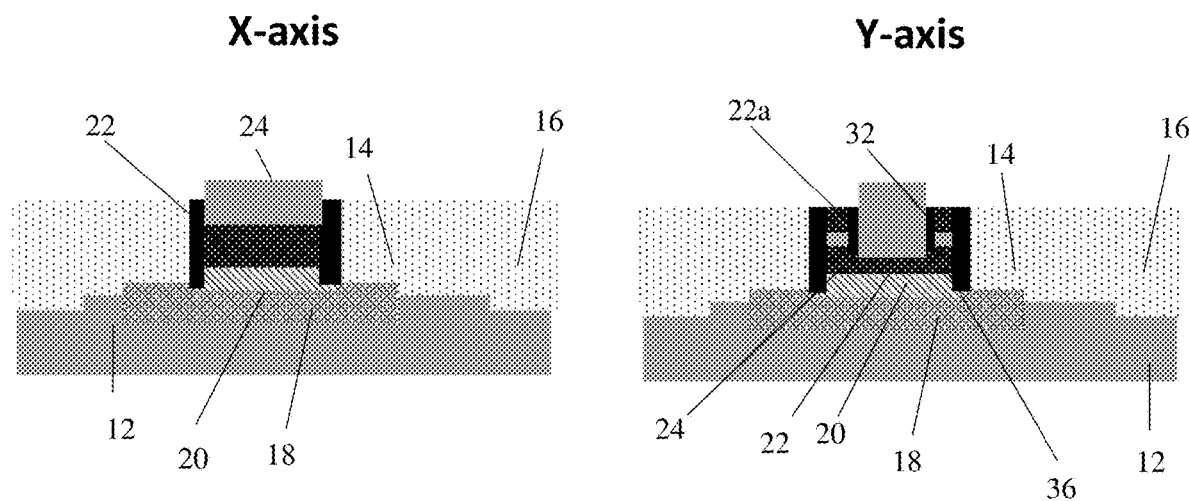

FIGS. 7A-7C show selective fabrication processes for manufacturing the heterojunction bipolar transistor 10a shown in FIG. 2A-2C (in the x-axis and the y-axis). In particular, FIG. 7A representatively shows the epitaxial growth process of the subcollector 18, collector 20, intrinsic base 22, marker layer 36 and the extrinsic base 22a. In embodiments, the subcollector 18 may be formed within the cavity shown in FIG. 6B; whereas the collector 20, intrinsic base 22, marker layer 36 and the extrinsic base 22a may be formed in the trench shown in FIG. 6C. The collector 20, intrinsic base 22, marker layer 36 and the extrinsic base 22a may be self-aligned and formed in a single epitaxial growth process as already described herein.

In FIG. 7B, the extrinsic base 22a and marker layer 36 may be etched to form a recess 27. In embodiments, the etching process may be a conventional recess etching process as described herein. A sidewall material 32 is formed within the recess 27 using conventional deposition and anisotropic etching processes, followed by the formation of the emitter 24 by another epitaxial growth process as shown in FIG. 7C. In this way, the heterojunction bipolar transistor 10a can be formed in two epitaxial processes.

Figure 8A:
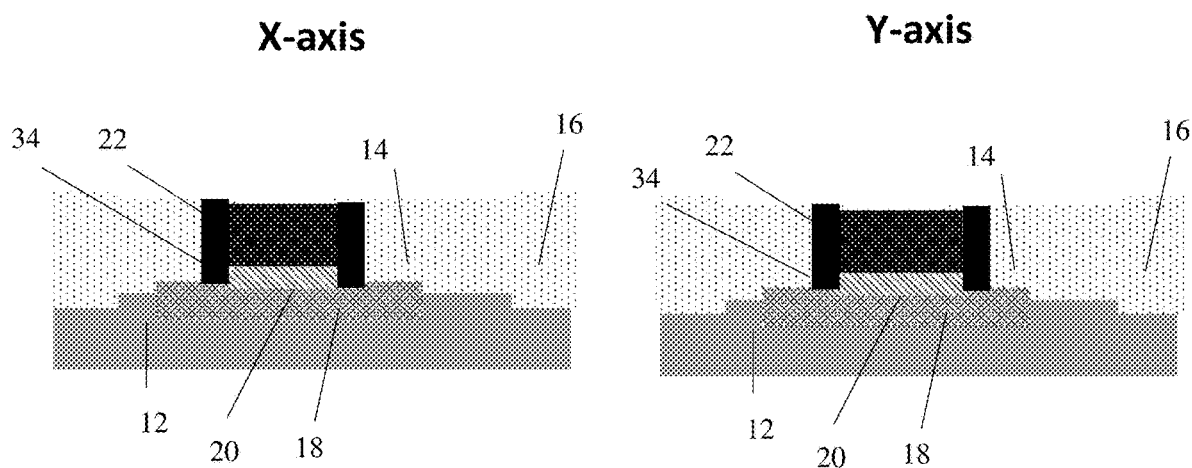
FIGS. 8A-8C show selective fabrication processes for manufacturing the heterojunction bipolar transistor shown in FIG. 5A-5C in accordance with further aspects of the present disclosure.
Figure 8B:
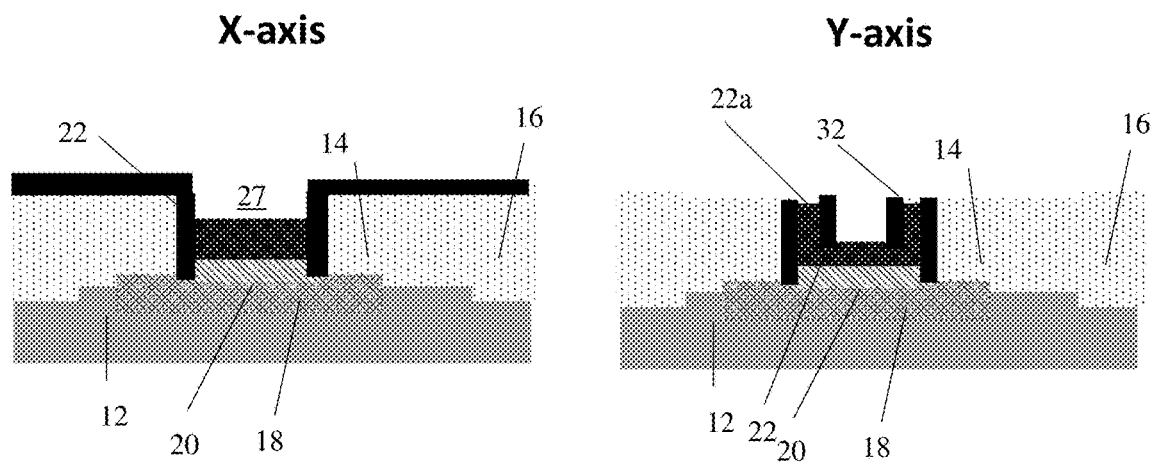
Figure 8C:
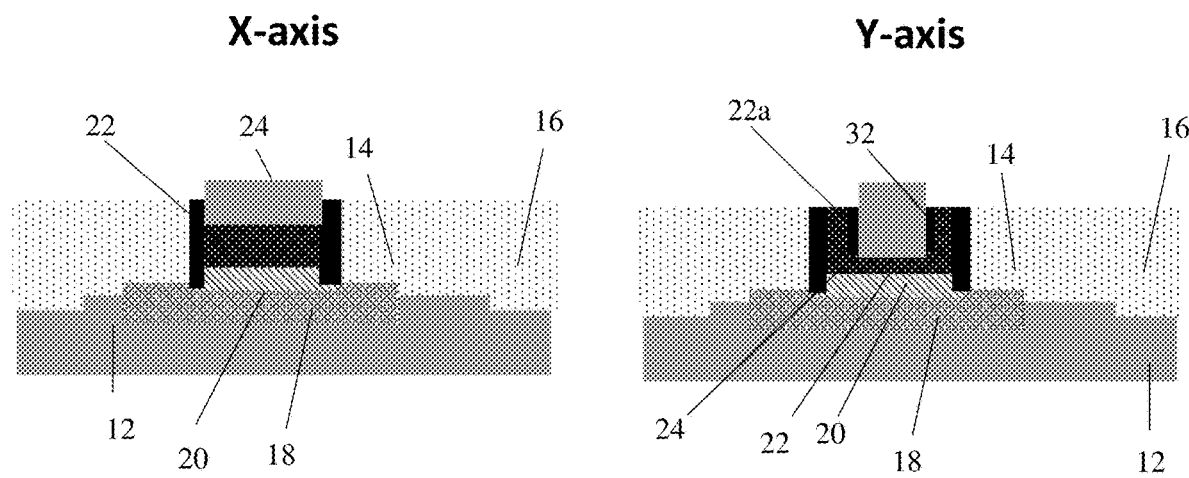

FIGS. 8A-8C show selective fabrication processes for manufacturing the heterojunction bipolar transistor 10d shown in FIG. 5A-5C (in the x-axis and the y-axis). In particular, FIG. 8A representatively shows the epitaxial growth process of the subcollector 18, collector 20 and base 22. In embodiments, the subcollector 18 may be formed within the cavity shown in FIG. 6B; whereas the collector 20 and base 22 may be formed in the trench shown in FIG. 6C. The collector 20 and base 22 may be self-aligned and formed in a single epitaxial growth process as already described herein.

In FIG. 8B, the base 22 may be etched to form a recess 27 and the extrinsic base 22a (e.g., U-shaped configuration in the y-axis). In embodiments, the etching process may be a conventional timed recess etching process as is known in the art. A sidewall material 32 may be formed within the recess 27 and on the sides of the extrinsic base 22a using conventional deposition and anisotropic etching processes, followed by the formation of the emitter 24 by another epitaxial growth process (e.g., of polysilicon material) as shown in FIG. 8C. In this way, the heterojunction bipolar transistor 10d can be formed in two epitaxial processes. Contacts may be formed in the conventional lithography, etching and deposition processes as already described herein, with the contacts being in axial alignment with each other.

The heterojunction bipolar transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a subcollector under a buried insulator layer;
a collector above the subcollector;
a base within the buried insulator layer;
an emitter above the base; and
contacts to the subcollector, the base and the emitter,
wherein the base comprises an extrinsic base and an intrinsic base at a same level, and
wherein the collector, the base and the emitter comprise a same width.

2. The structure of claim 1, wherein the buried insulator layer comprises a buried oxide layer of a semiconductor on insulator technology and the subcollector is formed within a handle substrate under the buried insulator layer.

3. The structure of claim 1, wherein the collector is within the buried insulator layer.

4. The structure of claim 3, wherein the emitter at least partially extends above the buried insulator layer.

5. The structure of claim 1, further comprising a spacer separating the emitter from a contact of the base.

6. The structure of claim 5, further comprising another spacer around a boundary of the base and the collector.

7. The structure of claim 1, wherein the buried insulator layer separates a contact of the subcollector from the base.

8. A structure comprising:
a subcollector under a buried insulator layer;
a collector above the subcollector;
a base within the buried insulator layer;
an emitter above the base; and
contacts to the subcollector, the base and the emitter,
wherein the base comprises an extrinsic base and an intrinsic base at a same level, and wherein the collector, the base, and the emitter are vertically aligned in a trench in the buried insulator layer.

9. A structure comprising:
a handle substrate comprising semiconductor material;
a buried oxide layer above the handle substrate; and
a heterojunction bipolar substrate comprising:
a subcollector within the handle substrate;

a base above the subcollector and within the buried oxide layer; and an emitter above the base; and contacts to the subcollector, the base and the emitter, wherein the base comprises an extrinsic base and an intrinsic base on a same level with the buried oxide layer.

10. The structure of claim 9, wherein the base comprises an extrinsic base above an intrinsic base with the buried oxide layer.

11. The structure of claim 10, further comprising a marker layer in between the extrinsic base and the intrinsic base.

12. The structure of claim 11, further comprising a spacer between the extrinsic base and the emitter.

13. The structure of claim 12, wherein another spacer is about a boundary of the base and the collector.

14. A structure comprising:
a handle substrate comprising semiconductor material;
a buried oxide layer above the handle substrate; and
a heterojunction bipolar substrate comprising:
a subcollector within the handle substrate;
a base above the subcollector and within the buried oxide layer; and
an emitter above the base; and
contacts to the subcollector, the base and the emitter,
wherein the base, the collector and the emitter are vertically aligned within a trench of the buried oxide layer.

15. A method comprises:
forming a subcollector under a buried insulator layer;
forming a collector above the subcollector and a base within the buried insulator layer in a single epitaxial growth process;
forming an emitter above the base in another epitaxial growth process; and
forming contacts to the subcollector, the base and the emitter,
wherein the base comprises an extrinsic base and an intrinsic base at a same level.

16. The method of claim 15, wherein the forming of the subcollector is formed by the single epitaxial growth process.

* * * * *